US009264033B2

(12) United States Patent
Mukherjee

(10) Patent No.: US 9,264,033 B2
(45) Date of Patent: Feb. 16, 2016

(54) FEED-FORWARD FREQUENCY CONTROL METHOD FOR CURRENT MODE HYSTERETIC BUCK REGULATOR

(71) Applicant: QUALCOMM Incorporated, San Diego, CA (US)

(72) Inventor: Sugato Mukherjee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 397 days.

(21) Appl. No.: 13/791,868

(22) Filed: Mar. 8, 2013

(65) Prior Publication Data

US 2014/0253181 A1 Sep. 11, 2014

(51) Int. Cl.
*H02M 3/156* (2006.01)
*H03K 17/56* (2006.01)

(52) U.S. Cl.
CPC ............. *H03K 17/56* (2013.01); *H02M 3/1563* (2013.01)

(58) Field of Classification Search
CPC ... H02M 3/156; H02M 3/1563; H02M 3/158; H02M 3/1588; H02M 2001/0025; H02M 2001/385; H02M 3/1584; H03K 17/56
USPC ......... 323/222–223, 225, 234, 271, 282–285, 323/299, 351
See application file for complete search history.

(56) References Cited

U.S. PATENT DOCUMENTS 8,008,902 B2 * 8/2011 Melanson et al. ............ 323/285
2004/0135563 A1 * 7/2004 Mihalka ........................ 323/282
2010/0301827 A1 12/2010 Chen et al.
2011/0121797 A1 5/2011 Daniel
2012/0001603 A1 * 1/2012 Ouyang et al. ................ 323/271
2012/0025919 A1 * 2/2012 Huynh ........................... 331/34
2012/0062144 A1 * 3/2012 Yao et al. ...................... 315/294
2013/0049711 A1 2/2013 Mirea

OTHER PUBLICATIONS

International Search Report and Written Opinion—PCT/US2014/020424—ISA/EPO—Aug. 20, 2014.

* cited by examiner

*Primary Examiner* — Timothy J Dole
*Assistant Examiner* — Ivan Laboy Andino
(74) *Attorney, Agent, or Firm* — Arent Fox LLP

(57) ABSTRACT

A hysteresis generator provides a hysteresis parameter V_hyst to a hysteresis comparator of a voltage regulator. The hysteresis parameter V_hyst is a function of circuit components of the hysteresis generator, a voltage output Vout of the regulator, a voltage input Vin of the regulator, and a signal that drives one of a plurality of switches of the regulator. A switch driver drives the switches based on the hysteresis parameter. One or more of the circuit components of the hysteresis generator that provide the hysteresis parameter also define a hysteresis time period T_hyst. The hysteresis time period T_hyst defines in combination with a delay time period T_Td of the regulator, a switching time period T for the regulator that is substantially constant.

18 Claims, 6 Drawing Sheets

FEED-FORWARD FREQUENCY CONTROL METHOD FOR CURRENT MODE HYSTERETIC BUCK REGULATOR

BACKGROUND

1. Field

The present disclosure relates generally to regulator circuitry, and more particularly, to a feed-forward frequency control method for a current mode hysteretic buck regulator.

2. Background

Hysteretic voltage regulators, e.g., buck regulators, are used in applications which require good transient response and/or fast speed of operation. This control scheme has variable switching frequency which helps achieve fast load transient response. However, average frequency control is useful for bucks which operate in an EMI sensitive environment like mobile phone applications. Phase locked loops can be used to control switching frequency but such implementation is costly in terms of power, area and typically requires external components like off-chip capacitors. In addition, closed loop average frequency control methods interfere with the dynamics of the main voltage control loop.

SUMMARY

A voltage regulator includes a plurality of switches, a hysteresis comparator, a hysteresis generator, and a switch driver. The hysteresis generator is configured to provide a hysteresis parameter V_hyst to the hysteresis comparator. The hysteresis parameter V_hyst is a function of circuit components of the hysteresis generator, a voltage output Vout of the regulator, a voltage input Vin of the regulator, and a signal that drives one of the plurality of switches. The switch driver is configured to drive the switches based on the hysteresis parameter. One or more of the circuit components of the hysteresis generator that provide the hysteresis parameter also define a hysteresis time period T_hyst. The hysteresis time period T_hyst defines in combination with a delay time period T_Td of the regulator, a switching time period T for the regulator that is substantially constant.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

A simple feed forward method of controlling switching frequency without large silicon area or off-chip components is described. The feed forward architecture does not interfere with the main voltage control loop in the first order. Operating frequency of a current mode hysteretic buck regulator depends on output voltage, inductor value, current sense gain, loop delay and operating duty cycle. The duty cycle dependent delay component is a significant contributor of the overall frequency of operation in hysteretic regulator operating over a high range of input and output voltage with small inductors. A circuit described below is used to generate a hysteresis value which cancels out to a first order effect of duty cycle variations.

Figure 1:
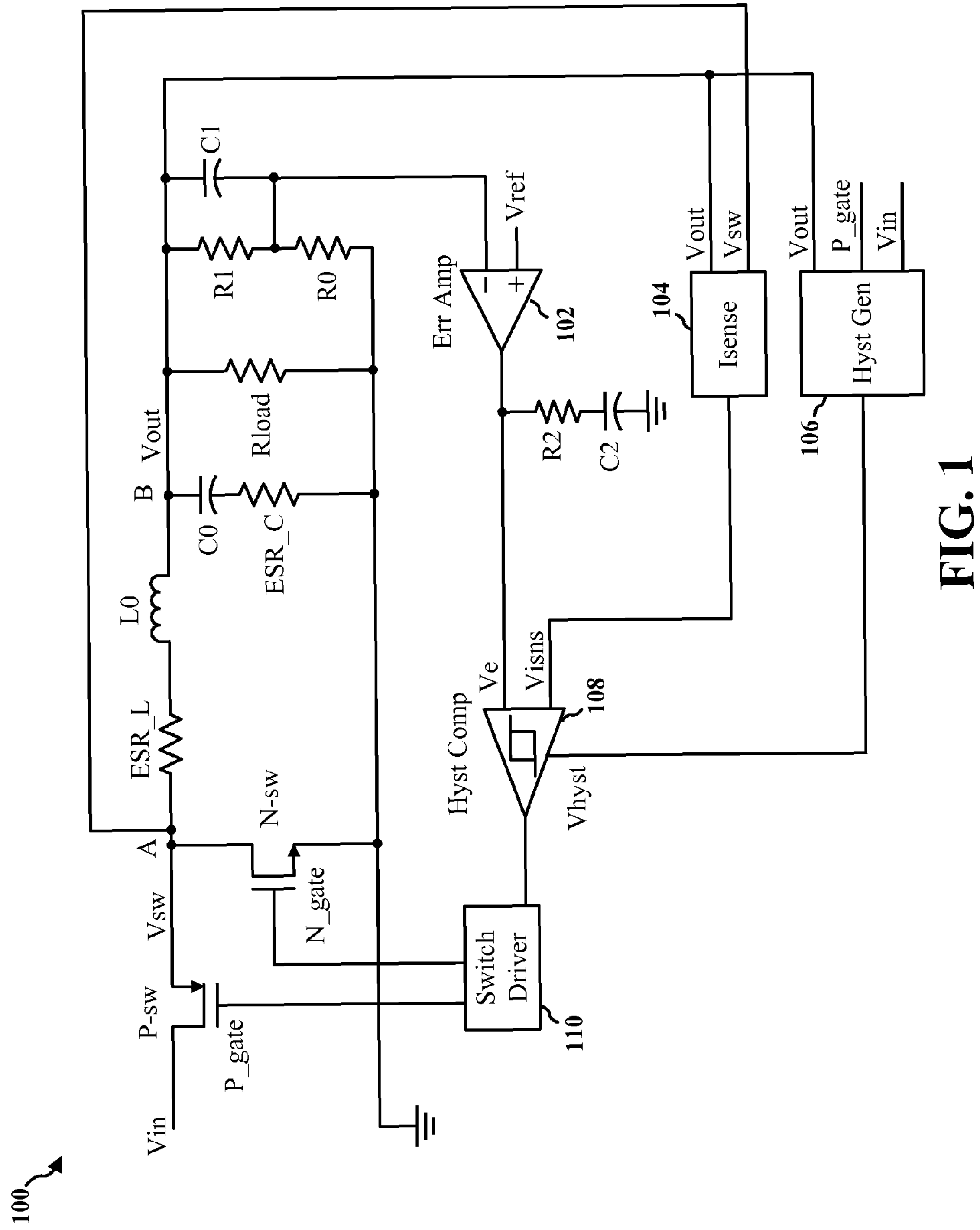
FIG. 1 is a schematic diagram of a voltage regulator.

FIG. 1 is a schematic diagram of a voltage regulator 100 that implements a buck converter. The voltage regulator 100 receives an input voltage Vin and generates an output voltage Vout for a load Rload. The voltage regulator 100 includes a first switch P-sw and a second switch N-sw that operate to provide a switch voltage Vsw at node A. Details of switch operation are provided below.

The voltage regulator 102 further includes an inductor L0, two resistors ESR_L and ESR_C and a capacitor C0. The inductor L0 has one end coupled to node A through the resistor ESR_L and the other end coupled to a node B. The capacitor C0 has one end coupled to node B and the other end coupled to circuit ground. The inductor L0 and capacitor C0 filter the switch voltage Vsw at node A to generate the output voltage Vout at node B. The inductor L0 and capacitor C0 may be of suitable values to provide the desired amount of filtering for Vout.

The output voltage Vout passes through a voltage divider formed by resistors R1 and R0 and capacitor C1 and is input to an error amplifier 102 at an inverting input. A reference voltage Vref is also input to the error amplifier 102 at a non-inverting input. The reference voltage Vref is a target voltage for Vout and may be a fixed value or a configurable value. The error amplifier 102 compares the two voltages to obtain an error, amplifies the error, and provides an amplified error signal Ve. The resistor R2 and capacitor C2 at the output of the error amplifier 102 provide filtering and frequency compensation.

The voltage regulator 100 also includes a current sense 104, a hysteresis generator 106, and hysteresis comparator 108 and a switch driver controller 110. The current sense 104 obtains the voltage across the inductor L0 through the voltage Vout on a first end of the inductor L0 and the switch voltage Vsw on the second side of the inductor L0, and senses the current through the inductor. The current sense 104 outputs a voltage sense Visns derived from the sensed current.

The hysteresis generator 106 receives the voltage Vout, a signal that drives the first switch P-sw and the input voltage Vin. The circuitry of the hysteresis generator 106 generates a hysteresis parameter, which may be a hysteresis voltage Vhyst or a hysteresis current Ihyst. The hysteresis parameter used further herein is a hysteresis voltage Vhyst. As describe further below, the hysteresis generator 106 is configured to provide a hysteresis parameter that allows the voltage regulator 102 to operate in a relatively constant frequency.

The hysteresis comparator 108 receives the amplified error signal Ve from the error amplifier 102, the voltage sense Visns from the current sense 104, and the hysteresis voltage Vhyst from the hysteresis generator 106 and generates control signals for the first and second switches P-sw, N-sw. For example, the hysteresis comparator 108 may include two comparators. A first comparator compares a summation of the amplified error signal Ve and the voltage hysteresis Vhyst to the voltage sense Visns and outputs a first signal Sp. A second comparator compares a difference of the amplified error signal Ve and the voltage hysteresis Vhyst to the voltage sense Visns and outputs a second signal Sn.

The first and second output signals Sp and Sn of the hysteresis comparator 108 are input to the switch driver controller 110 and output respectively as switch control signals P_gate and N_gate. Switch control signal P_gate drives the P gate of the first switch P-sw, while switch control signal N_gate drives the N gate of the second switch N-sw. The first switch P-sw may be a P-channel power field effect transistor (FET) switch with its source coupled to the input voltage Vin, its gate receiving the P_gate control signal, and its drain coupled to node A. The second switch N-sw may be an N-channel FET switch with its drain coupled to the node A, its gate receiving the N_gate signal, and its source coupled to circuit ground. The first switch P-sw is turned on when the P_gate signal is at logic low, and the second switch N-sw is turned on when the N_gate signal is at logic high. The P_gate and N_gate control signals may be generated such that at most one switch is turned on at any given moment. The first and second switches provide the switch voltage Vsw output signal at node A. This output signal is a square wave signal that swings from Vin to circuit ground and has a duty cycle determined by Vout.

The majority of the voltage regulator 100 may be fabricated on an integrated power management circuit (IC), with several circuit components remaining external to the IC chip. For example, the inductor L0, two resistors ESR_L, ESR_C and Rload, and the capacitor C0 are external to the power management IC.

The voltage regulator 100 operates as follows. During an On state, the first switch P-sw is turned on by the P_gate signal, and the second switch N-sw is turned off by the N_gate signal. The input voltage Vin is coupled via the first switch P-sw to the inductor L0, which stores energy from the Vin supply voltage. The current through the inductor L0 rises during the On state, with the rate of the rise being dependent on the difference between Vin and Vout and the inductance L of the inductor L0. During an Off state, the first switch P-sw is turned off by the P_gate signal, and the Vin supply voltage is disconnected from the inductor L0. The second switch N-sw is turned on by the N_gate signal, and the inductor L0 is coupled between circuit ground and node B. The current through the inductor L0 falls during the Off state, with the rate of the fall being dependent on the output voltage Vout and the inductance L. The input voltage Vin thus provides current to the capacitor C0 and the load Rload during the On state, and the inductor L0 provides its stored energy to the capacitor C0 and load Rload during the Off state. The capacitor C0 maintains the output voltage Vout at node B and also provides its charge to load Rload during the Off state.

For an ideal buck converter, the output voltage Vout from the buck converter may be expressed as:

$$Vout = D \times Vin \quad \text{(Eq. 1)}$$

where D is the duty cycle of the switch control signals P_gate and N_gate. The duty cycle is the percentage of time that the buck converter is in the On state.

As shown in equation (1), the output voltage Vout may be varied by adjusting the duty cycle of the switch control signals P_gate and N_gate for the switches P-sw and N-sw. When the output voltage Vout is below Vref, the first switch P-sw may be turned on longer to bring up the output voltage Vout. Conversely, when the output voltage Vout is above Vref, the first switch P-sw may be turned on shorter to bring down the output voltage Vout.

As mentioned previously, the inductor L0 and capacitor C0 provide filtering for the regulator output signal at node A. In general, a larger inductor L0 and/or a larger capacitor C0 may provide more filtering, which may reduce the magnitude of ripples on the voltage output Vout at node B. The sizes of inductor L0 and capacitor C0 may be selected based on a tradeoff between the amount of ripple, cost, and area.

When the voltage regulator switches one or both of the first and second switches P-sw and N-sw from an on state to an off state or from an off state to an on state, there is an amount of delay between the time a decision to switch is made and the time the switch actually occurs. This delay is referred to as “loop delay” and is an inherent parameter of a voltage regulator. The amount of loop delay is a function of function of duty cycle.

Figure 2:
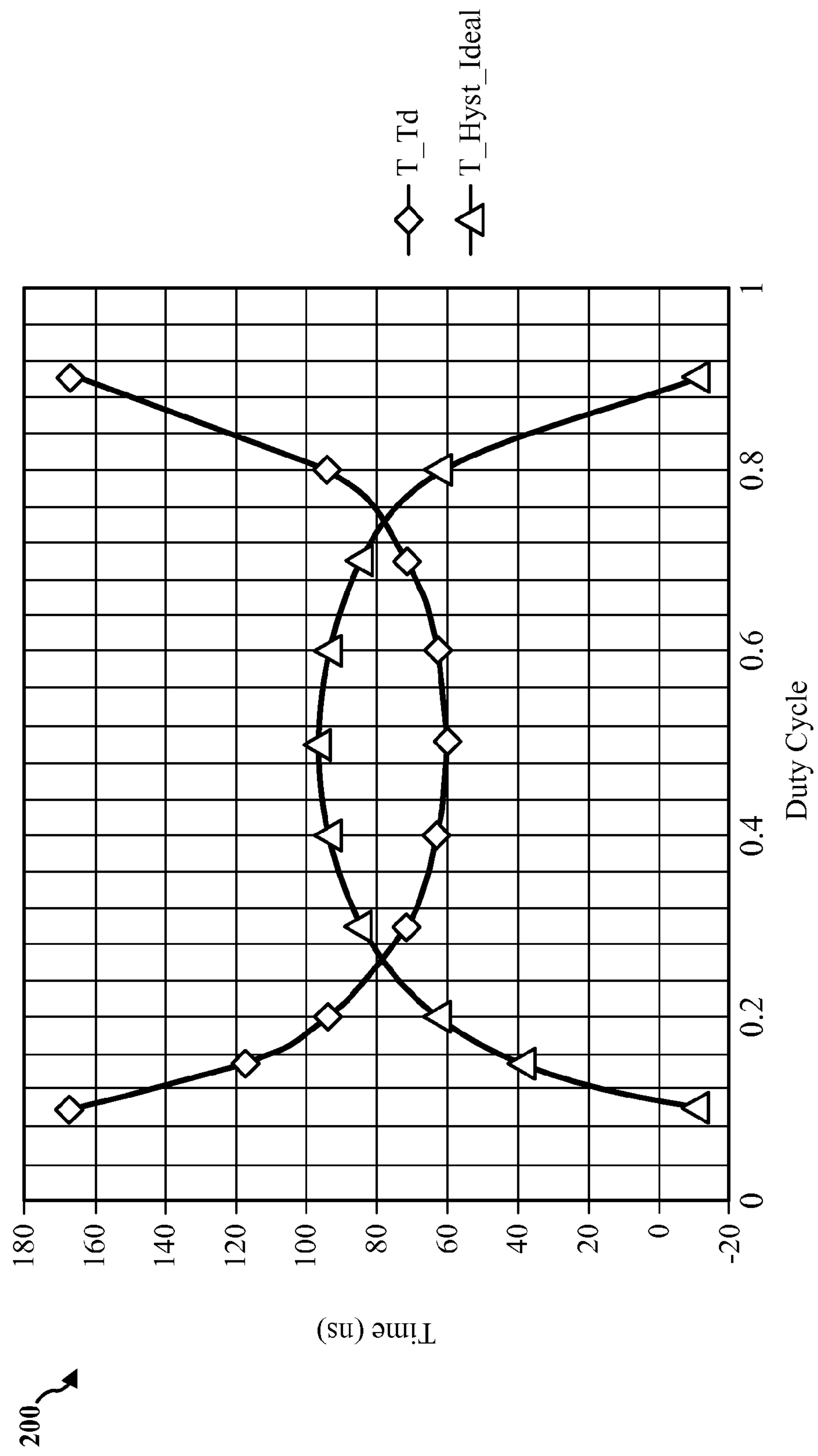
FIG. 2 is a graph illustrating changes in time delay of a voltage regulator as a function of duty cycle.

FIG. 2 is a graph illustrating the time period of operation (or frequency of operation) of a voltage regulator as a function of duty cycle D of the voltage regulator, where D=Vout/Vin. The curve T_Td represents changes in the time period T of the voltage regulator as a function of duty cycle that are due to the inherent loop delay Td of the voltage regulator. In other words, T_Td is a function of the inherent loop delay Td and the duty cycle D. The curve T_Td indicates a minimum time delay Td, and thus a minimum affect on time period T, when the duty cycle is close to 0.5. The time delay Td, and thus the affect on time period T, increases non-linearly on both sides as the duty cycle changes. Thus, the presence of the inherent time delay Td causes the time period T of the voltage regulator to vary significantly as a function of duty cycle.

Buck regulators work at very different duty cycles, preferably while maintaining a substantially constant time period T. In order to maintain a substantially constant time period T independent of duty cycle variations, the voltage regulator disclosed herein provides a hysteresis time period T_hyst that compensates for the varying time period corresponding to the curve T_Td. The T_hyst curve illustrated in FIG. 2 is essentially an inverse of the curve T_Td. A combination of the two curve results in a substantially fixed operating frequency, i.e., fixed switching time period T.

The hysteresis time period T_hyst is derived from circuit elements within the hysteresis generator 106 of FIG. 1. These circuit elements are the same elements that provide the hysteresis parameter V_hyst to the hysteresis comparator 108.

Figure 3:
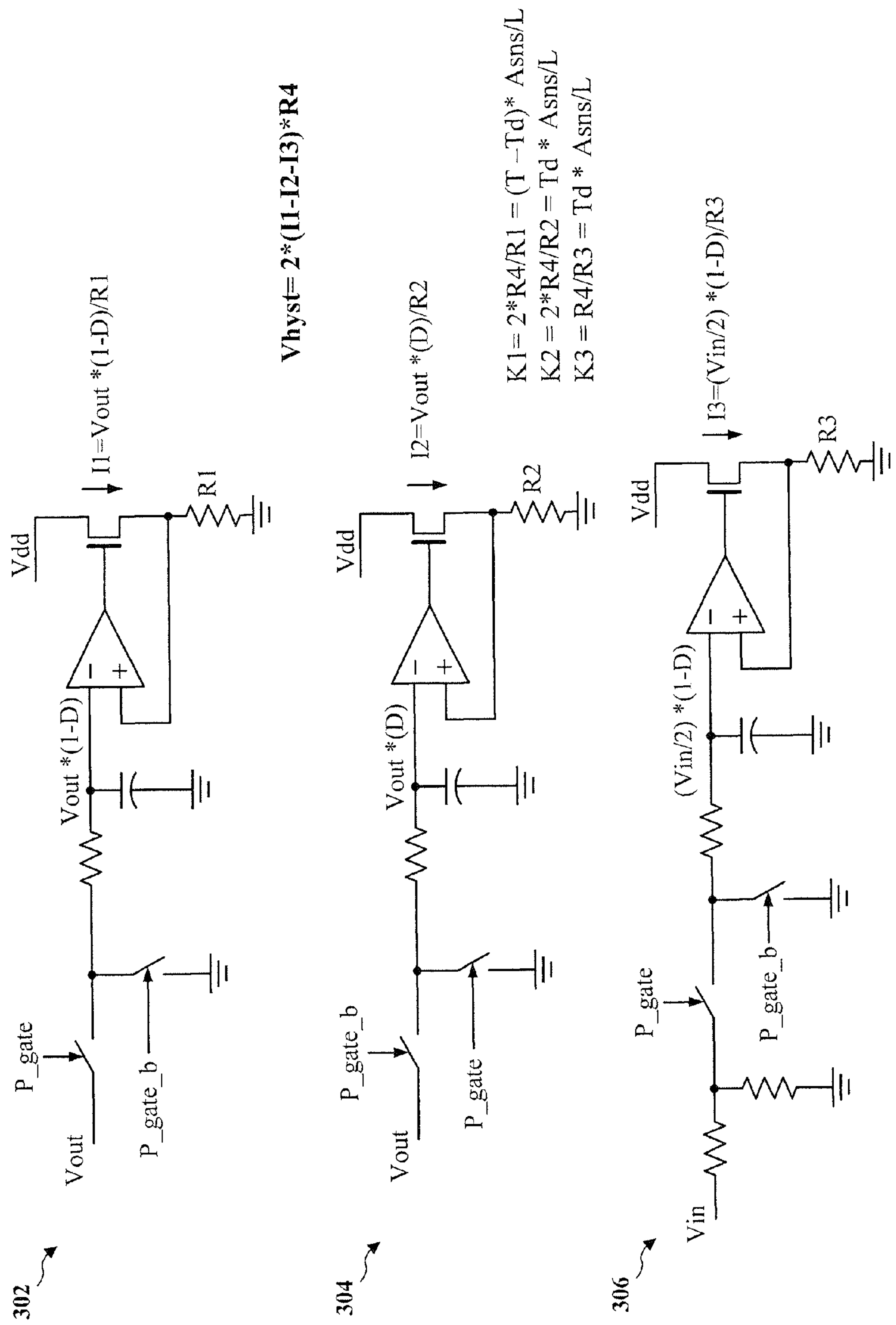
FIG. 3 is a schematic diagram of a hysteresis generator component of the voltage regulator of FIG. 1.

FIG. 3 is a schematic of the hysteretic generator 106. As previously described, the hysteretic generator has the following set of inputs: a voltage output Vout of the buck regulator, a voltage input Vin of the buck regulator, and a signal that drives a P gate switch of the buck regulator.

The hysteretic generator 106 includes first, second and third circuits 302, 304, 306, which provide measures of a first current I1, a second current I2 and a third current I3, respectively. Each circuit 302, 303, 304 includes a pair of switches P_gate and P_gate_b that operate in accordance with switch P-sw of the voltage regulator. More specifically, when the switch P-sw of the voltage regulator is closed, the P-gate switches of the circuits 302, 304, 306 are closed and the P_gate_b switches are open. Conversely, when the switch P-sw of the voltage regulator is opened, the P-gate switches of the circuits 302, 304, 306 are opened and the P_gate_b switches are closed.

The first circuit 302 receives output voltage Vout and provides a voltage Vout×(1−D) to an input of an amplifier when the P-gate is closed. The voltage is output by the amplifier to a gate of a FET. A resistor with a resistance R1 is coupled to the drain of the FET and provides a measure of the current I1 as follows: I1=Vout×(1−D)/R1.

The second circuit 304 receives output voltage Vout and provides a voltage Vout×D) to an input of an amplifier when the P-gate is closed. The voltage is output by the amplifier to a gate of a FET. A resistor with a resistance R2 is coupled to the drain of the FET and provides for the current I2 as follows: I2=Vout×(D)/R2.

The third circuit 306 receives output voltage Vin and provides a voltage (Vin/2)×(1−D) to an input of an amplifier when the P-gate is closed. The voltage is output by the amplifier to a gate of a FET. A resistor with a resistance R3 is coupled to the drain of the FET and provides for the current I3 as follows: I3=(Vin/2)×(1−D)/R3.

Based on these currents I1, I2, and I3, the hysteresis parameter Vhyst is provided as follows:

$$Vhyst=2*(I1-I2-I3)*R4 \quad \text{(Eq. 2)}$$

where resistance R4 (not shown) is provided by a fourth resistor (not shown) through which the summation of currents (I1, I2, I3) pass.

As described above, the hysteresis parameter Vhyst is provided to the hysteresis comparator 108 for use in controlling the switches P-sw and N-sw of the voltage regulator. The circuitry of the hysteresis generator 106 includes elements selected to provide a hysteresis time period T_hyst, which in combination with the inherent time delay T_Td of the voltage regulator, results in a substantially constant operating period for the voltage regulator, independent of duty cycle changes.

To this end, the hysteresis time period T_hyst may be synthesized as follows:

$$T\_hyst=Vhyst*L/\{Asns*Vout*(1-D)\} \quad \text{(Eq. 3)}$$

where L is the known inductor value for the voltage regulator (e.g., L0 of FIG. 1), Asns is a current sense gain based on a voltage sensed across the inductor L and a current through the inductor, and Vhyst=[K1*Vout*(1−D)]−[K2*Vout*D]−[K3*Vin*(1−D)], where D=Vout/Vin, K1=2*R4/R1, K2=2*R4/R2 and K3=R4/R3

Based on the foregoing, the hysteresis time period T_hyst may be defined as follows:

$$T\_hyst=L/Asns*\{[K1]-[K2*D/(1-D)]-[K3*1/D]\} \quad \text{(Eq. 4)}$$

where L is the known inductor value for the voltage regulator (e.g., L0 of FIG. 1), Asns is a current sense gain based on a voltage sensed across the inductor L and a current through the inductor, D=Vout/Vin, K1=2*R4/R1, K2=2*R4/R2 and K3=R4/R3.

A delay time period T_Td for the voltage regulator may be provided as follows:

$$T\_Td=Td*\{1+D/(1-D)+1/D\}, \text{ or} \quad \text{(Eq. 5)}$$

$$T\_Td=Td*\{2+D/(1-D)+(1-D)/D\} \quad \text{(Eq. 6)}$$

where Td is a known value for the voltage regulator obtained through measurement, and D=Vout/Vin.

A time period T based on the hysteresis time period T_hyst and a delay time period T_Td is provided as follows:

$$T=T\_Td+T\_hyst \quad \text{(Eq. 7)}$$

Combining equation 4 and equation 5 above to obtain time period T, and choosing circuit components R1, R2, R3 and R4 such that K2=K3=(Td*Asns/L), results in:

$$T=Td+[K1*L/Asns] \quad \text{(Eq. 8)}$$

This time period T is independent of duty cycle D. Thus, the hysteresis generator and the circuitry therein provide a hysteresis parameter that controls the switch of the buck regulator so that the regulator maintains a substantially constant switching time period.

Figure 4:
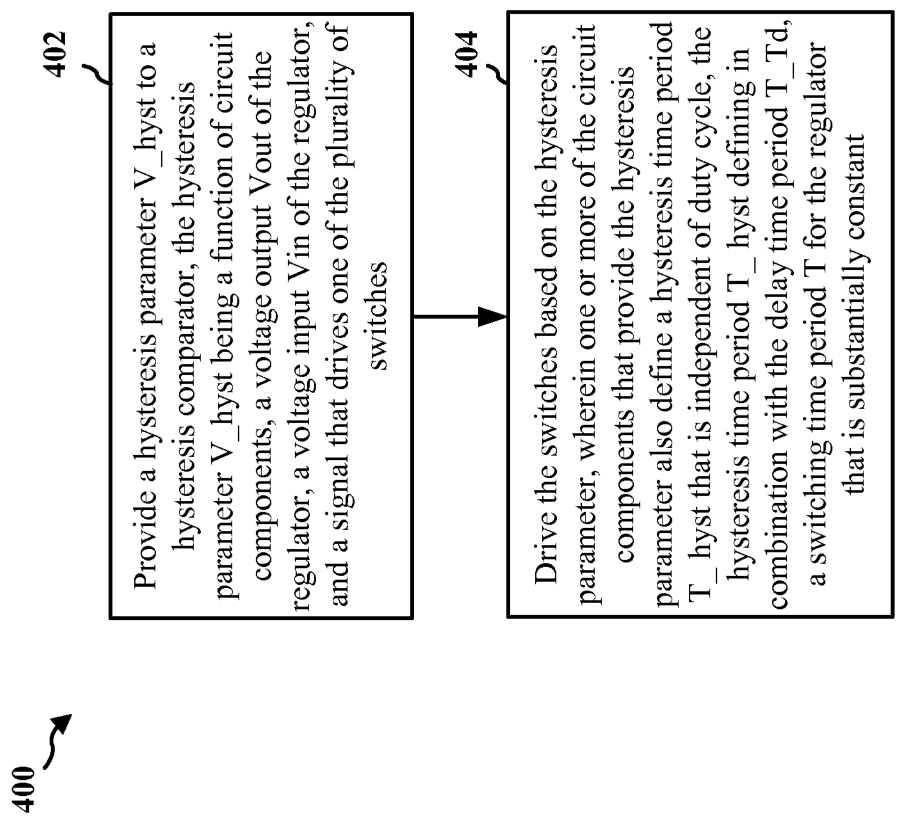
FIG. 4 is a flow chart of a method of operating a voltage regulator.

FIG. 4 is a flow chart 400 of a method of operating a voltage regulator having a plurality of switches and a delay time period T_Td. The method may be performed by one or more components of the voltage regulator, including for example, a hysteresis generator, a hysteresis comparator, and a switch driver. At step 402, a hysteresis generator provides a hysteresis parameter V_hyst to a hysteresis comparator. The hysteresis parameter V_hyst is a function of circuit components, a voltage output Vout of the regulator, a voltage input Vin of the regulator, and a signal that drives one of the plurality of switches.

At step 404, a switch driver drives the switches based on the hysteresis parameter. One or more of the circuit components that provide the hysteresis parameter also define a hysteresis time period T_hyst. The hysteresis time period T_hyst defines in combination with the delay time period T_Td, a switching time period T for the regulator that is substantially constant.

In one configuration, the circuit components that provide the hysteresis parameter for the switch driver include a first resistor having a resistance R1, a second resistor having a resistance R2, a third resistor having a resistance R3, and a fourth resistor having a resistance R4. These resistors, along with other circuit components, such as those shown in FIG. 3, provide the hysteresis parameter V_hyst as follows:

$$V\_hyst=2*(I1-I2-I3)*R4$$

where I1 is based on Vout and R1, I2 is based on Vout and R2, I3 is based on Vin and R3.

In one configuration, the hysteresis time period is provided by:

$$T\_hyst=Vhyst*L/\{Asns*Vout*(1-D)\}$$

where L is the inductance of an inductor of the regulator, Asns is based on a voltage sensed across the inductor and a current through the inductor, and D=Vout/Vin.

Resistors R1, R2, R3 and R4 may be chosen such that:

$$T\_hyst=L/Asns*\{[K1]-[K2*D/(1-D)]-[K3*1/D]\}$$

where K1=2*R4/R1, K2=2*R4/R2, and K3=R4/R3.

Resistors R2, R3 and R4 may be further chosen such that the switching time period T of the regulator is independent of duty cycle and is provided by:

$$T=Td+[K1*L/Asns]$$

where Td is a known value for the voltage regulator.

Figure 5:
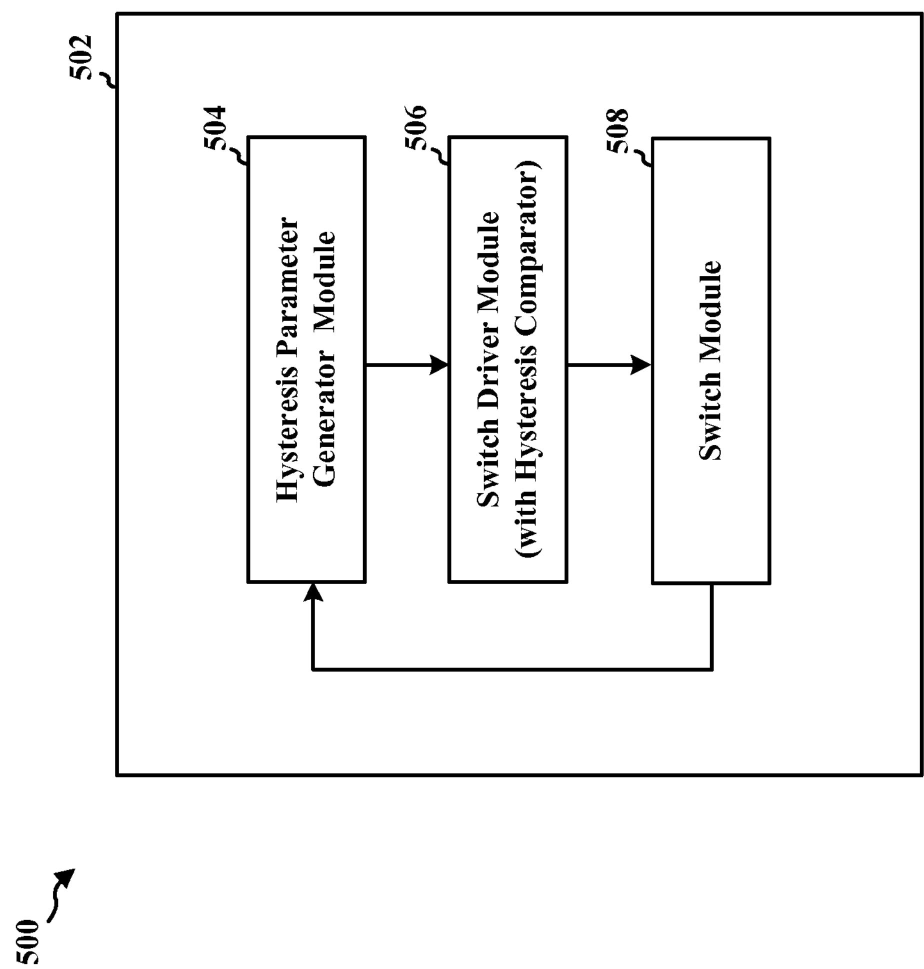
FIG. 5 is a signal flow diagram illustrating the signal flow between different modules/means/components of a voltage regulator.

FIG. 5 is a high level signal flow diagram 500 illustrating the signal flow between different modules/means/components in an exemplary voltage regulator 502. The regulator 502 includes a hysteresis parameter generator module 504, a switch driver module 506 that includes a hysteresis comparator, and a switch module 508 that includes a plurality of switches. The modules of the voltage regulator 502 perform each of the steps of the process in the aforementioned flow chart of FIG. 4. The modules may be one or more hardware components specifically configured to carry out the stated steps.

The hysteresis parameter generator module 504 provides a hysteresis parameter V_hyst to the hysteresis comparator of the switch drive module 506. The hysteresis parameter V_hyst is a function of circuit components of the hysteresis parameter generator module, a voltage output Vout of the regulator, a voltage input Vin of the regulator, and a signal that drives one of the plurality of switches in the switch module

508. The circuit components of the hysteresis parameter generator module 504 may include components of FIG. 3.

The switch driver module 506 drives the switches of the switch module 508 based on the output of the hysteresis comparator, whose output is based on the hysteresis parameter provided by the hysteresis parameter generator module 504. One or more of the circuit components that provide the hysteresis parameter also define a hysteresis time period T_hyst. The hysteresis time period T_hyst defines in combination with the delay time period T_Td, a switching time period T for the regulator that is substantially constant. The switch driver module 506 may include the hysteresis comparator 108 and switch driver 110 of FIG. 1.

The switch module 508 receives switch control signals from the switch driver module 506 and operates in accordance with the switch signal. The switch module 508 may include the switch P-sw and switch N-sw of FIG. 1.

In one configuration, the voltage regulator 502 includes means for providing a hysteresis parameter V_hyst to a hysteresis comparator, the hysteresis parameter V_hyst being a function of circuit components, a voltage output Vout of the regulator, a voltage input Vin of the regulator, and a signal that drives one of the plurality of switches. The voltage regulator also includes means for driving a plurality of switches based on the hysteresis parameter, wherein one or more of the circuit components that provide the hysteresis parameter also define a hysteresis time period T_hyst. The hysteresis time period T_hyst defines in combination with a delay time period T_Td of the regulator, a switching time period T for the regulator that is substantially constant. The aforementioned means may be one or more of the aforementioned modules of the voltage regulator 502.

Figure 6:
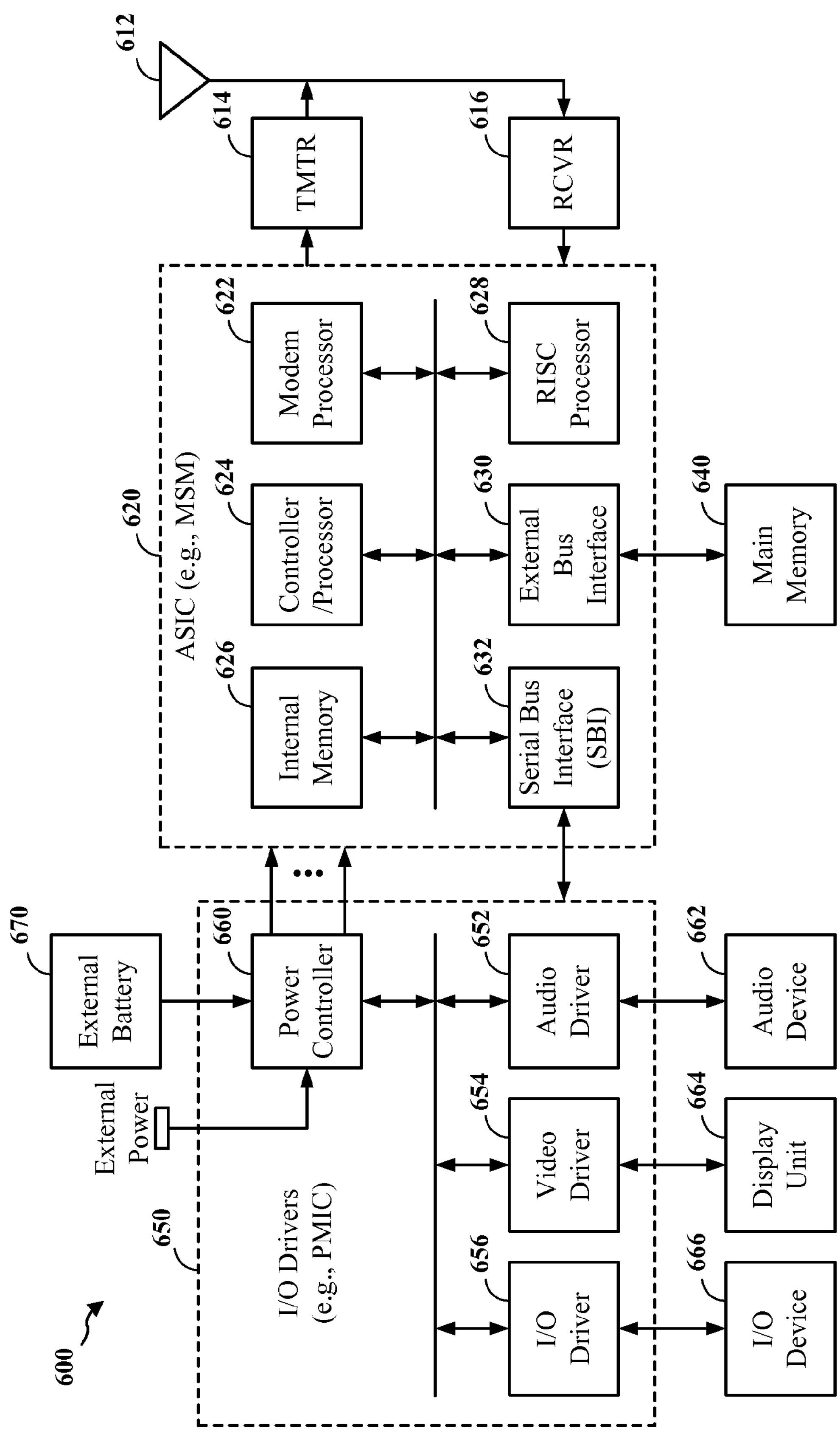
FIG. 6 is a block diagram of a wireless communications device.

FIG. 6 shows a block diagram of a design of a wireless communication device 600. Wireless device 600 may be a cellular phone, a terminal, a handset, a personal digital assistant (PDA), etc. Wireless device 600 may be capable of communicating with one or more wireless communication systems such as a Code Division Multiple Access (CDMA) system, a Global System for Mobile Communications (GSM) system, a wireless local area network (WLAN), etc.

Wireless device 600 is capable of providing bi-directional communication via a transmit path and a receive path. On the transmit path, a transmitter (TMTR) 614 receives data from an application specific integrated circuit (ASIC) 620, processes and conditions the data, and generates a modulated signal, which is transmitted via an antenna 612 to base stations. On the receive path, signals transmitted by the base stations are received by antenna 612 and provided to a receiver (RCVR) 616. Receiver 616 conditions and digitizes the received signal and provides samples to ASIC 620 for further processing.

ASIC 620 may include various processing, interface and memory units such as, e.g., a modem processor 622, a controller/processor 624, an internal memory 626, a reduced instruction set computing (RISC) processor 628, an external bus interface (EBI) 630, and a serial bus interface (SBI) 632. Modem processor 622 may perform processing for data transmission and reception, e.g., encoding, modulation, demodulation, decoding, etc. RISC processor 628 may perform various types of processing for wireless device 600, e.g., processing for video, graphics, higher layer applications, etc. Controller/processor 624 may direct the operation of various units within ASIC 620. Internal memory 626 may store data and/or instructions for various units within ASIC 620. External bus interface 630 may facilitate transfer of data between ASIC 620 and a main memory 640, which may provide bulk storage for data and program codes used by ASIC 620. Serial bus interface 632 may facilitate communication between ASIC 620 and an ASIC 650.

ASIC 650 may include various circuit blocks such as, e.g., an audio driver 652, a video driver 654, an input/output (I/O) driver 656, and a power controller 660. Audio driver 652 may drive an audio device 662. Video driver 654 may drive a display unit 664. I/O driver 656 may drive an I/O device 666. Power controller 660 may couple to an external battery 670 and/or receive external power via a power connector. Power controller 660 may generate output voltages for the processing units within ASIC 620. Power controller 660 may implement any of the designs shown in FIGS. 1 and 3-5. ASIC 620 may be partitioned into multiple power domains in order to facilitate powering down in idle mode. Each power domain may include circuit blocks coupled to a respective output voltage and may correspond to one load 660 in FIG. 6.

ASIC 620 may be a Mobile Station Modem (MSM) from Qualcomm Incorporated. ASIC 650 may be a Power Management IC (PMIC) from Qualcomm Incorporated. ASICs 620 and 650 may also be other ICs from other manufacturers. ASICs 620 and 650 may each comprise a single IC die or multiple IC dies.

The voltage regulator with transient recovery circuits described herein may be implemented on an IC, an analog IC, a radio frequency IC (RFIC), a mixed-signal IC, an ASIC, a printed circuit board (PCB), an electronics device, etc. The voltage regulator with transient recovery circuits may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the voltage regulator with transient recovery circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as an MSM, (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of operating a voltage regulator having a plurality of switches and an inherent delay time period T_Td in switching one or more of the plurality of switches, said method comprising:

providing a hysteresis parameter V_hyst to a hysteresis comparator, the hysteresis parameter V_hyst being a function of a voltage output Vout of the voltage regulator, a voltage input Vin of the voltage regulator, and a signal that drives one of the plurality of switches; and canceling out variances in a switching time period T for the voltage regulator caused by the inherent delay time period T_Td by driving the plurality of switches based on the hysteresis parameter V_hyst, wherein a hysteresis time period T_hyst is derived by the driving of the plurality of switches based on the hysteresis parameter V_hyst, and wherein the hysteresis time period T_hyst cancels out the variances in the switching time period T caused by the inherent delay time period T_Td.

2. The method of claim 1, wherein the hysteresis parameter V_hyst is provided by:

$$V\_hyst=2*(I1-I2-I3)*R4$$

where I1 is based on Vout and a first resistance R1, I2 is based on Vout and a second resistance R2, I3 is based on Vin and a third resistance R3, and V_hyst is based on I1, I2, I3, and a fourth resistance R4.

3. The method of claim 2, wherein the hysteresis time period T_hyst is provided by:

$$T\_hyst=V\_hyst*L/\{Asns*Vout*(1-D)\}$$

where L is the inductance of an inductor of the voltage regulator, Asns is based on a voltage sensed across the inductor and a current through the inductor, and D=Vout/Vin.

4. The method of claim 3, wherein R1, R2, R3 and R4 are such that:

$$T\_hyst=L/Asns*\{[K1]-[K2*D/(1-D)]-[K3*1/D]\}$$

where K1=2*R4/R1, K2=2*R4/R2, and K3=R4/R3.

5. The method of claim 4, wherein the inherent delay time period T_Td of the voltage regulator is provided by:

$$T\_Td=Td*\{1+D/(1-D)+1/D\}$$

where Td is a known value for the voltage regulator, and D=Vout/Vin.

6. The method of claim 4, wherein R2, R3 and R4 are such that the switching time period T of the voltage regulator is provided by:

$$T=T\_Td+T\_hyst=Td+[K1*L/Asns]$$

where Td is a known value for the voltage regulator.

7. A voltage regulator having a plurality of switches and an inherent delay time period T_Td in switching one or more of the plurality of switches, comprising:

means for providing a hysteresis parameter V_hyst to a hysteresis comparator, the hysteresis parameter V_hyst being a function of a voltage output Vout of the voltage regulator, a voltage input Vin of the voltage regulator, and a signal that drives one of the plurality of switches; and means for canceling out variances in a switching time period T for the voltage regulator caused by the inherent delay time period T_Td, the means for canceling out variances in a switching time period T configured to drive the plurality of switches based on the hysteresis parameter V_hyst, wherein a hysteresis time period T_hyst is derived by the means for canceling out variances in a switching time period T, and wherein the hysteresis time period T_hyst cancels out the variances in the switching time period T caused by the inherent delay time period T_Td.

8. The voltage regulator of claim 7, wherein the hysteresis parameter V_hyst is provided by:

$$V\_hyst=2*(I1-I2-I3)*R4$$

where I1 is based on Vout and a first resistance R1, I2 is based on Vout and a second resistance R2, I3 is based on Vin and a third resistance R3, and V_hyst is based on I1 I2, I3, and a fourth resistance R4.

9. The voltage regulator of claim 8, wherein the hysteresis time period T_hyst is provided by:

$$T\_hyst=V\_hyst*L/\{Asns*Vout*(1-D)\},$$

where L is the inductance of an inductor of the voltage regulator, Asns is based on a voltage sensed across the inductor and a current through the inductor, and D=Vout/Vin.

10. The voltage regulator of claim 9, wherein R1, R2, R3 and R4 are such that:

$$T\_hyst=L/Asns*\{[K1]-[K2*D/(1-D)]-[K3*1/D]\}$$

where K1=2*R4/R1, K2=2*R4/R2, and K3=R4/R3.

11. The voltage regulator of claim 10, wherein the inherent delay time period T_Td of the voltage regulator is provided by:

$$T\_Td=Td*\{1+D/(1-D)+1/D\}$$

where Td is a known value for the voltage regulator, and D=Vout/Vin.

12. The voltage regulator of claim 10, wherein R2, R3 and R4 are such that the switching time period T of the voltage regulator is provided by:

$$T=T\_Td+T\_hyst=Td+[K1*L/Asns]$$

where Td is a known value for the voltage regulator.

13. A voltage regulator, comprising:

a plurality of switches, the voltage regulator having an inherent delay time period T_Td in switching one or more of the plurality of switches;

a hysteresis comparator;

a hysteresis generator configured to provide a hysteresis parameter V_hyst to the hysteresis comparator, the hysteresis parameter V_hyst being a function of a voltage output Vout of the voltage regulator, a voltage input Vin of the voltage regulator, and a signal that drives one of the plurality of switches; and a switch driver configured to cancel out variances in a switching time period T for the voltage regulator caused by the inherent delay time period T_Td by driving the plurality of switches based on an output of the hysteresis comparator, wherein a hysteresis time period T_hyst is derived by the driving of the plurality of switches based on the output of the hysteresis comparator, and wherein the hysteresis time period T_hyst cancels out the variances in the switching time period T caused by the inherent delay time period T_Td.

14. The voltage regulator of claim 13, wherein the hysteresis parameter V_hyst is provided by:

$$V\_hyst=2*(I1-I2-I3)*R4$$

where I1 is based on Vout and a first resistance R1, I2 is based on Vout and a second resistance R2, I3 is based on Vin and a third resistance R3, and V_hvst is based on I1, I2, I3, and a fourth resistance R4.

15. The voltage regulator of claim 14, wherein the hysteresis time period T_hyst is provided by:

$$T\_hyst=V\_hyst*L/\{Asns*Vout*(1-D)\},$$

where L is the inductance of an inductor of the voltage regulator, Asns is based on a voltage sensed across the inductor and a current through the inductor, and D=Vout/Vin.

16. The voltage regulator of claim 15, wherein R1, R2, R3 and R4 are such that:

$$T\_hyst=L/Asns*\{[K1]-[K2*D/(1-D)]-[K3*1/D]\}$$

where K1=2*R4/R1, K2=2*R4/R2, and K3=R4/R3.

17. The voltage regulator of claim 16, wherein the inherent delay time period T_Td of the voltage regulator is provided by:

$$T\_Td=Td*\{1+D/(1-D)+1/D\}$$

where Td is a known value for the voltage regulator, and D=Vout/Vin.

18. The voltage regulator of claim 16, wherein R2, R3 and R4 are such that the switching time period T of the voltage regulator is provided by:

$$T=T\_Td+T\_hyst=Td+[K1*L/Asns]$$

where Td is a known value for the voltage regulator.

* * * * *